United States Patent
Siess et al.

(10) Patent No.: US 9,595,554 B2
(45) Date of Patent: Mar. 14, 2017

(54) SENSOR ARRANGEMENT WITH A SILICON-BASED OPTICAL SENSOR AND A SUBSTRATE FOR FUNCTIONAL LAYER SYSTEMS

(71) Applicant: MAZeT GmbH, Jena (DE)

(72) Inventors: Gunter Siess, Kraftsdorf (DE); Marcus Roeppischer, Kaulsdorf (DE); Wilfried Krueger, Erfurt (DE)

(73) Assignee: MAZeT GmbH, Jena (DE)

( * ) Notice: Subject to any disclaimer, the term of this patent is extended or adjusted under 35 U.S.C. 154(b) by 225 days.

(21) Appl. No.: 14/272,680

(22) Filed: May 8, 2014

(65) Prior Publication Data

US 2014/0339663 A1  Nov. 20, 2014

(30) Foreign Application Priority Data

May 14, 2013  (DE) ........................ 10 2013 104 968

(51) Int. Cl.
*H01L 31/0232* (2014.01)
*H01L 27/146* (2006.01)
*G01J 1/04* (2006.01)
*G01J 1/42* (2006.01)
*G01J 3/50* (2006.01)
(Continued)

(52) U.S. Cl.
CPC ...... *H01L 27/14625* (2013.01); *G01J 1/0418* (2013.01); *G01J 1/0477* (2013.01); *G01J 1/42* (2013.01); *G01J 3/50* (2013.01); *H01L 27/1446* (2013.01); *H01L 31/02165* (2013.01)

(58) Field of Classification Search
CPC ......... H01L 31/02165; H01L 31/02325; H01L 27/14685; H01L 27/14625; H01L 27/14621; G02B 5/28; G02B 5/284; G01J 1/0488
See application file for complete search history.

(56) References Cited

U.S. PATENT DOCUMENTS

| 5,703,357 A | 12/1997 | Shih |
| 7,330,266 B2 | 2/2008 | Guerineau |
| 7,626,241 B1 | 12/2009 | Dierschke |

(Continued)

FOREIGN PATENT DOCUMENTS

| EP | 2009696 A2 | 12/2008 |
| JP | 05316284 | 11/1992 |

*Primary Examiner* — Matthew Landau
*Assistant Examiner* — Scott Stowe
(74) *Attorney, Agent, or Firm* — Patentbar International, P.C.

(57) ABSTRACT

A sensor arrangement with a silicon-based optical sensor, particularly color sensors for colorimetric applications is disclosed. The invention aims to find a novel possibility for suppressing interference ripples occurring in optical sensors when adding substrates with optically functional coatings which permits a simple production without complicated adaptation layers. The sensor passivation is composed of a combination of thin $SiO_2$ layer in the range of 5 to 10 nm and an antireflection-matched $Si_3N_4$ layer and a substrate which carries at least one optical filter is arranged over the sensor passivation and connected to the sensor by means of an adhesive and forms an intermediate space between sensor surface and optical filter which is filled with an optical medium having a low refractive index ($n_2$) and a height variation ($\Delta h$) over the associated sensor surface.

10 Claims, 9 Drawing Sheets

(51) Int. Cl.
*H01L 31/0216* (2014.01)
*H01L 27/144* (2006.01)

(56) References Cited

U.S. PATENT DOCUMENTS

2010/0026866 A1    2/2010   Matsumoto
2015/0138560 A1*   5/2015   Kasahara .............. G01J 3/0213
                                                                                        356/451

\* cited by examiner

SENSOR ARRANGEMENT WITH A SILICON-BASED OPTICAL SENSOR AND A SUBSTRATE FOR FUNCTIONAL LAYER SYSTEMS

RELATED APPLICATIONS

This application claims priority to German Patent Application No. DE 10 2013 104 968.0, filed May 14, 2013, which is incorporated herein by reference in its entirety.

FIELD OF THE INVENTION

The invention is directed to a sensor arrangement with a silicon-based optical sensor, particularly for daylight sensors or color sensors for colorimetric applications.

The connection of optical sensors to functional glasses (preferably substrates with interference filters which cannot be coated directly on the sensor) leads to two undesirable additively superimposed interference ripples in the passivation layer of the light-sensitive sensor portion on the one hand and in the intermediate layer (air or adhesive) with respect to the functional cover glass on the other hand. Each on its own influences the spectral sensitivity resulting from the base sensitivity of the sensor and the transmission characteristic of the substrate placed upon it. The magnitude of the interference ripples is influenced by the index of refraction and the thicknesses of the layers.

Figure 2:
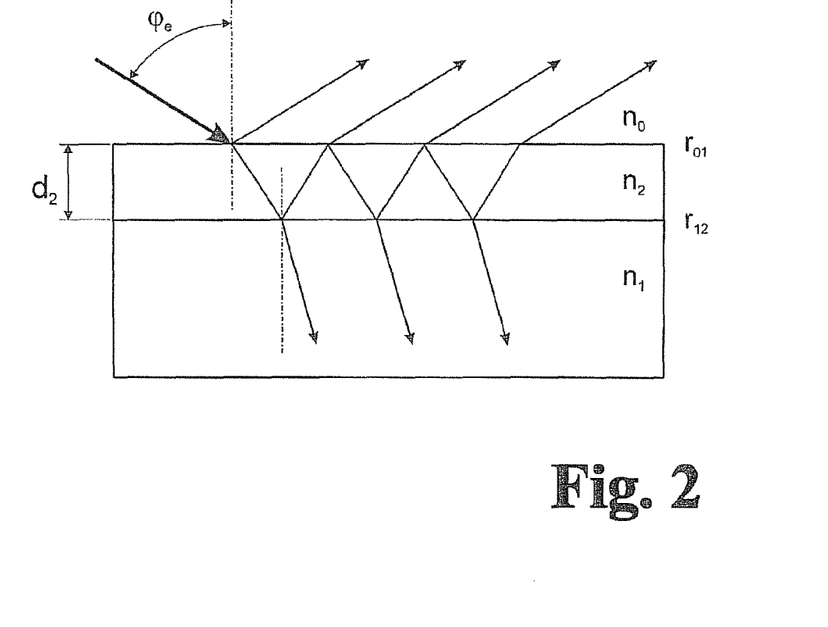
FIG. 2 is a three phase model for describing the layer interference at a layer with a large difference in the refractive index relative to the adjoining media (phases)
Figure 4:
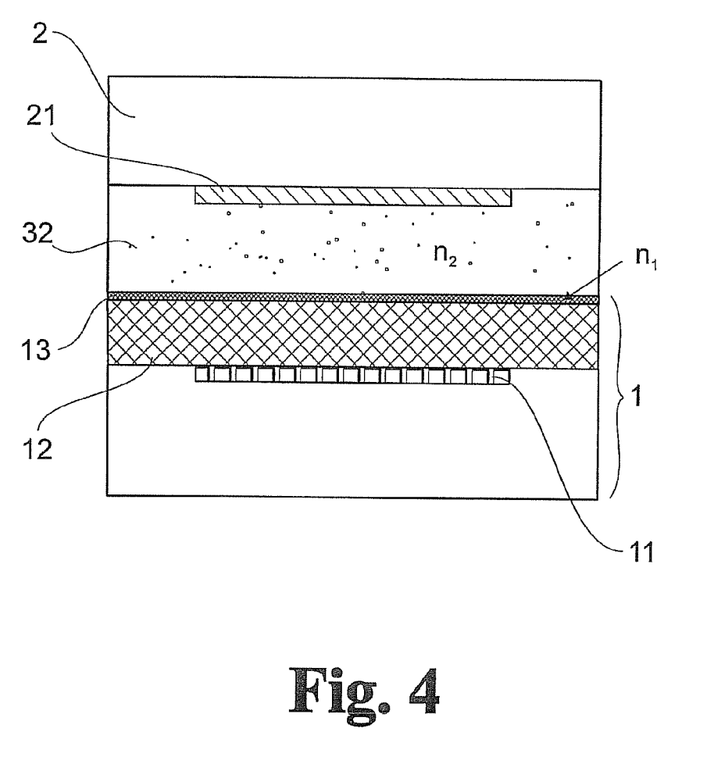
FIG. 4 is an illustration of a conventional sensor arrangement without interference-suppressing measures.
Figure 5A:
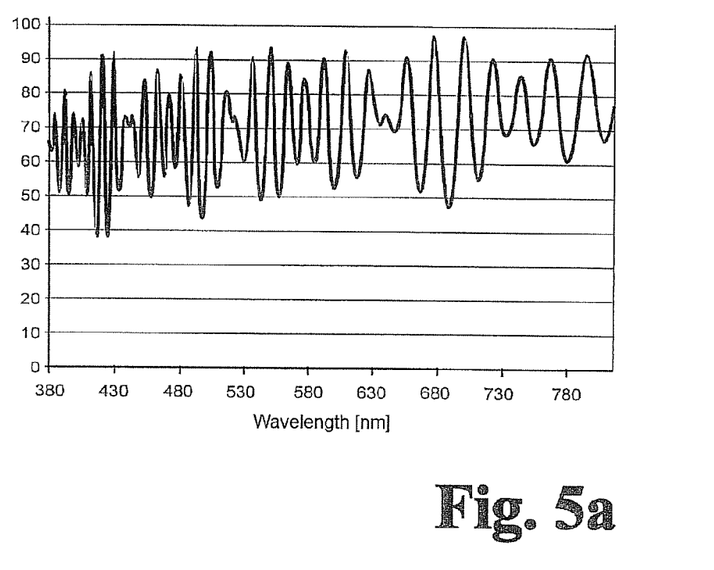
FIG. 5a is a graph showing the interferences occurring through the sensor passivation on a Si wafer and subsequent gluing of a substrate with a transparent adhesive according to the construction in FIG. 4.
Figure 5B:
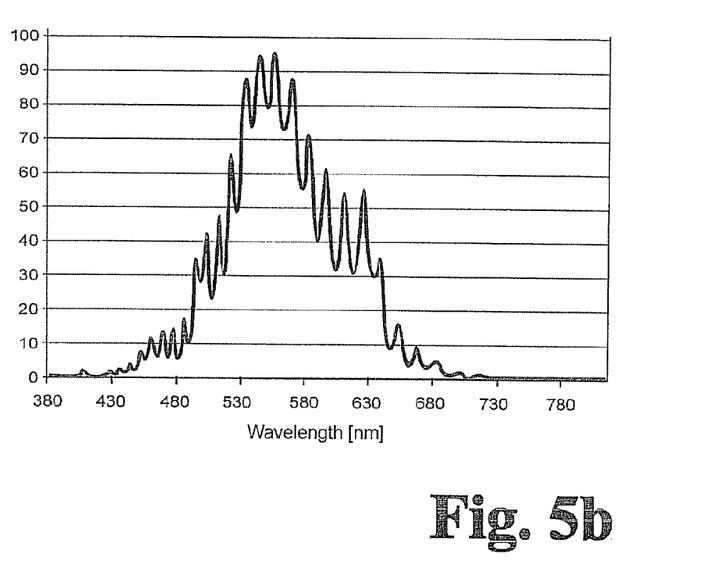
FIG. 5b is a graph showing the resulting spectral sensitivity for a sensor with Y tristimulus function without matching the layer system located above it.

Minimizing these effects is crucial for the areas of application of the sensor particularly for optical sensors requiring defined transmission characteristics (e.g., for daylight sensors or color sensors for colorimetric applications). FIG. 5b shows the spectral sensitivity of a sensor with tristimulus function Y resulting in the absence of suitable steps for suppressing interference ripples. FIG. 4 shows the associated sensor which has not previously been described in this way but which can be assembled in a simple manner from known layer systems by means of an optical adhesive. When an interference filter is arranged on the sensor (e.g., a silicon diode), strong layer interferences are brought about within the adhesive layer. The reason for this is the sharp difference between the refractive index of the adhesive layer and the Si surface of the sensor or of the passivation layers of the sensor which likewise contain silicon and the refractive index of the glued-on substrate which can contain additional layers of high-refractive index and low-refractive index materials. As will be described in detail in the following, the interference structures can be described by means of a simple three phase model which takes into account the adhesive layer between semi-infinite media (phases) of air (above) and Si diode (below). This model is shown in FIG. 2 and reveals different complex refractive indices $n_i$ for the different media: air ($n_0$), adhesive ($n_2$) and Si diode ($n_1$). The thickness of the applied adhesive layer is designated by $d_2$, and $\phi_e$ represents the angle of incidence of the light.

BACKGROUND OF THE INVENTION

In the prior art for suppressing layer interferences it is known from U.S. Pat. No. 7,626,241 B1 to reduce thin film interference ripples in coated sensor surfaces through variably adjusted thicknesses in different regions of the thin film. Due to the integration of the sensors in integrated circuits with embedded signal processing and intermediate metal layers, the silicon dioxide layer for passivation of the silicon is relatively thick and is therefore responsible for the interference ripples. Due to the jump in the refractive index between the Si sensor and the passivation layer, the latter is applied over the light-sensitive sensor surface with two different thicknesses so that the interferences ideally average out.

This has the disadvantage that these partial differences in thickness must be produced for each light-sensitive surface directly in the wafer fabrication process which is already complex.

SUMMARY OF THE INVENTION

It is the object of the invention to find a novel possibility for suppressing interference ripples occurring in optical sensors when adding substrates with optically functional coatings which permits a simple implementation in the production of the sensors without adaptation layers which are complicated to carry out.

According to the invention, this object is met in a sensor arrangement with at least one silicon-based optical sensor with a sensor passivation in that the sensor passivation is composed of a combination of thin $SiO_2$ layer and antireflection-matched $Si_3N_4$ layer, wherein the $SiO_2$ layer has a thickness in the range of 5 to 10 nm, in that there is arranged over the sensor passivation a substrate which carries at least one optical filter and which is connected to the sensor by means of an adhesive and forms between a light-sensitive sensor surface and an associated optical filter an intermediate space for purposes of an optical layer with a lower refractive index than the sensor, and in that the optical layer has a height variation over the associated light-sensitive sensor surface.

The height variation is advantageously realized by tilting the substrate relative to the light-sensitive sensor surface. For this purpose, spacers are advisably provided on the substrate for tilting the substrate, these spacers being produced in defined position and height in the process of producing the optical filter.

In an alternative variant, the height variation is advisably realized by a defined gradation of the substrate relative to the light-sensitive sensor surface in areas of equal size for arranging at least two height-offset filter segments. The gradation of the substrate is preferably produced by structured glass deposition on the substrate.

The intermediate space between light-sensitive sensor surface and associated optical filter can be filled with any optical medium. It is advantageously filled with an adhesive layer. It can also advisably contain as optical medium an air layer which is at least partially surrounded by adhesive. Alternatively, liquids, e.g., immersion oils, can also be used.

The tilting of the substrate is preferably adjusted to generate interference ripples of different frequencies with a quantity of superposition periods which are mixingly superposed and mutually compensating. In this regard, the height variation $\Delta h$ for optimal tilting can advisably be determined by the equation $\Delta h = x \cdot \lambda/(2n_2)$.

The defined gradation of the substrate for generating a height variation $\Delta h$ is advantageously adjusted to generate interference ripples of different phase-shifted frequencies which are destructively superposed and mutually compensating. In this regard, the height variation $\Delta h$ for the gradation of the substrate when applying two filter segments for optimal cancellation can be determined by the equation $\Delta h = \frac{1}{2}\lambda/(2n_2)$.

The spacers for tilting the substrate are preferably formed as filter stacks by successively arranged filter layers, and the filter layers of the filter stacks are formed in the same manner and with the same height as individual optical filters.

The invention is based on the fundamental consideration that defined thickness gradations of passivation layers or additional antireflection layers in the production of sensors are too complicated or prone to error. Further, the separate substrates which are required when outfitting with interference filters can only be connected to the sensor by gluing processes so that a layer which generates further interferences must be taken into account. Therefore, the invention uses a special construction of the sensor passivation of silicon dioxide layer ($SiO_2$) and silicon nitride layer ($Si_3N_4$), wherein the $SiO_2$ layer is reduced to a thickness of between 5 and 10 nm over the entire region of the light-sensitive sensor surfaces and the $Si_3N_4$ layer is adjusted to an adapted thickness of between 30 and 70 nm for optical antireflection to the visible (VIS) spectral range. The thickness $d_1$ of the $Si_3N_4$ layer is calculated from the refractive index $n_1$ of $Si_3N_4$ (approximately 1.95) and the wavelength $\lambda$ for an optimal antireflection by $d_1 = \lambda/(4\ n_1)$.

The layer interferences of an adhesive layer lying on top for fixing the substrate to at least one multiple-layer optical filter (e.g., interference color filter) are carried out according to the invention in such a way that the substrate with the filter layers is directed toward the sensor and is arranged at a reproducibly defined different distance relative to the sensor for suppression of the interference ripples. The intermediate space up to the sensor passivation is preferably filled with the utilized adhesive but can also be air or a liquid. The different distance which is varied by the height of the intermediate space over the sensor passivation leads to the suppression of the interference ripples in that the optical coupling is optimized by the superposition (or mixing) of different layer interferences in the intermediate space.

The superposition in the intermediate space can be carried out by tilting (inclining) in a first variant or by gradations in the substrate of the optical filters in a second variant. Tilting causes a mixing of interference ripples of different frequencies with x superposition periods. The more different periods are superposed, the more uniform the mixing.

Alternatively, it is possible to produce the substrate in a stepped manner, for example, by structured glass deposition, so that at least two regions of identical size but with different heights are formed in the intermediate space over the light-sensitive sensor surface, and the layer interference patterns of the at least two regions cancel each other out (condition: $\Delta h = \frac{1}{2} \cdot \lambda/2 \cdot n_2$). If three or four regions of identical size are produced, the cancellation condition must be adapted for $\frac{1}{3} \cdot \lambda$ or $\frac{1}{4} \cdot \lambda$, respectively.

The invention allows the interference ripples of optical sensors which arise when adding substrates with optically functional coatings to be suppressed and realized in a simple manner without the need for adaptation layers which are complicated to carry out.

BRIEF DESCRIPTION OF THE DRAWINGS

The invention will be described more fully in the following with reference to embodiment examples. In the drawings.

DETAILED DESCRIPTION OF THE PREFERRED EMBODIMENTS

Figure 1:
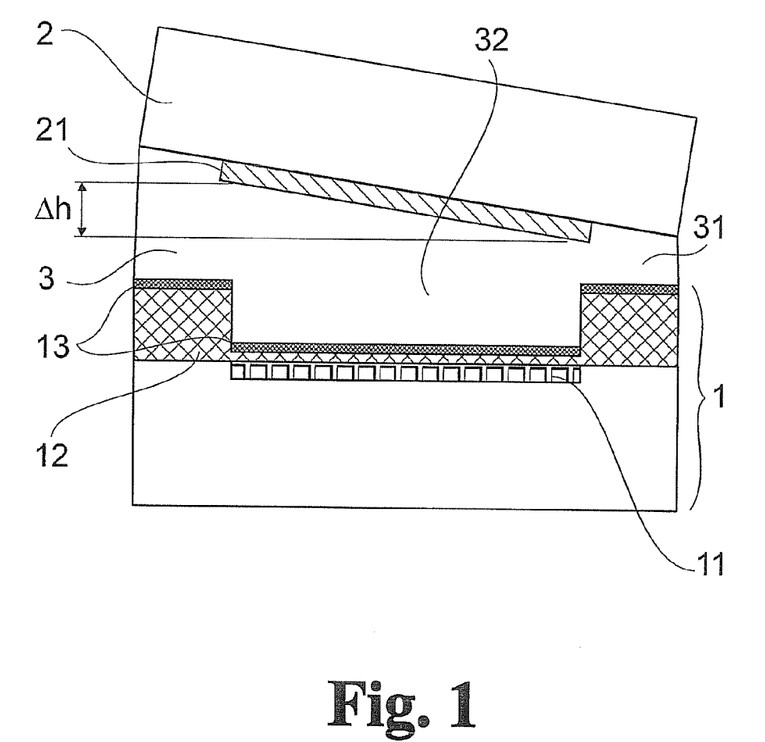
FIG. 1 is a schematic diagram of the invention with antireflective sensor passivation and height variation of the distance of an optical filter from a light-sensitive sensor surface.

The basic construction of a sensor arrangement according to the invention shown in FIG. 1 comprises a silicon-based sensor 1 with a light-sensitive sensor surface 11 and a sensor passivation of $SiO_2$ layer 12 and $Si_3N_4$ layer 13, a substrate 2 with at least one optical filter 21 having a height variation $\Delta h$ over the light-sensitive sensor surface 11 and an intermediate space 3 which—without limiting generality—is filled with an adhesive 31 in the embodiment in FIG. 1 and forms a homogeneous, non-absorbing adhesive layer 32. However, as is shown exclusively in the embodiment in FIG. 7, it is also possible to form the intermediate space 3 as air layer 33 or to fill it with a liquid (not shown), for example, immersion oils such as are known from microscopy, in which case the adhesive 31 only forms the edge fastening between sensor 1 and substrate 2. At the same time, substrate 2 forms the upper termination of the sensor arrangement, where substrate 2 has the at least one optical filter system 21 at the bottom side facing the sensor 1, and one or more additional outer coatings 22 (e.g., for antireflection or IR shielding) can be arranged on the upper outer surface.

As was already mentioned above, the connection of an optical sensor 1 to a functional substrate 2 with optical filters (e.g., cover glass with interference filters) leads to undesirable interference ripples in the detected signal through sensor passivation layers $SiO_2$ layer 12 and $Si_3N_4$ layer 13 on the one hand and through the medium in the intermediate space 3 (adhesive 31 or air 33) with respect to the substrate 2 (cover glass) on the other hand. Every kind of interference ripple by itself influences the spectral sensitivity (see FIG. 5b) resulting from the basic sensitivity of the sensor 1 and the transmission characteristic of the substrate 2 placed thereon. The amplitude and frequency of the interference ripples are governed by the refractive index and layer thicknesses.

A general description of these interference structures can be given in a simple three phase model, where the uppermost semi-infinite phase comprises air ($n_0$), the center phase represents adhesive ($n_2$) and the bottom semi-infinite phase is the Si diode ($n_1$). This construction is shown in FIG. 2, where $d_2$ is the thickness of the layer arranged on the Si diode, $n_i$=0, 1, 2 designates the complex refractive index of the corresponding medium of the individual phases, and $\phi_e$ is the incident angle of the light.

In general, the following equations apply for the complex reflection coefficients for perpendicularly polarized light and parallel-polarized light at an interface between two media (1 and 2) under perpendicular incident light:

$$r_p = \frac{n_2 - n_1}{n_2 + n_1} \quad r_s = \frac{n_1 - n_2}{n_1 + n_2} \tag{1}$$

Considering once more the aforementioned three phase model, the layer construction gives the following reflection coefficients:

$$r_p = \frac{r_p^{01} + r_p^{12} e^{2i\beta}}{1 + r_p^{01} r_s^{12} e^{2i\beta}} \quad r_s = \frac{r_s^{01} + r_s^{12} e^{2i\beta}}{1 + r_s^{01} r_p^{12} e^{2i\beta}}, \tag{2}$$

where $r_{ij}$ designates the reflection coefficients between layers i and j, and $\beta$ designates the unitless phase thickness. There is given the following equation under perpendicular light incidence:

$$\beta = \frac{2\pi \cdot d \cdot n_1}{\lambda} \tag{3}$$

The reflectivity is given by the square (multiplied by the complex conjugate) of the reflection coefficient, where the perpendicular and parallel components for unpolarized light are equal. Accordingly, the reflection within these models will be:

$$R = \frac{(r_p^{01})^2 + (r_p^{12})^2 + 2 \cdot (r_p^{01}) \cdot (r_p^{12}) \cdot \cos\left(\frac{4\pi \cdot d \cdot n_1}{\lambda}\right)}{1 + 2 \cdot (r_p^{01})^2 (r_p^{12})^2 \cos\left(\frac{4\pi \cdot d \cdot n_1}{\lambda}\right)} \tag{4}$$

A simple construction according to FIG. 4 with non-absorbing media: filter: $n_0$=2.38, adhesive: $n_2$=1.554 and silicon: $n_1$=4 gives the reflectivities shown in FIG. 3 for the different layer thicknesses $d_2$ of the adhesive 31 indicated in the legend.

Owing to the non-reproducible thicknesses $d_2$ of the adhesive 31, these effects cannot be taken into account in the design of the filter or filters 21 or of the entire sensor arrangement. The disadvantage of the interferences shown in FIG. 3 consists in that the desired spectral characteristic of the sensor 1 is falsified. Further, the frequency of falsification is not predictable and therefore cannot be corrected.

Figure 3:
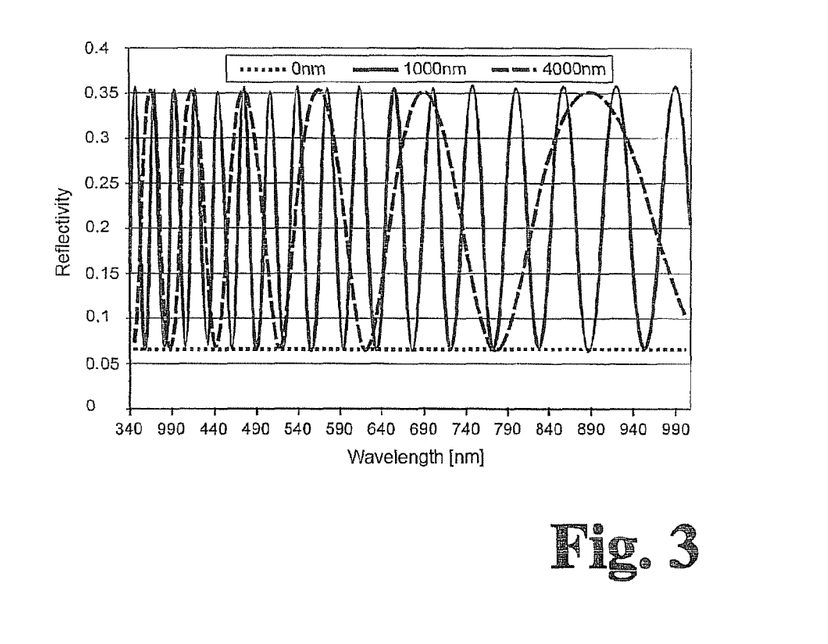
FIG. 3 is a graph showing reflectivity over wavelength for three different layer thicknesses in the phase model of FIG. 2.

By virtue of the locally different layer thickness $d_2$, a height variation $\Delta h$, according to the invention, of the distance of the filter 21 above the light-sensitive sensor surface 11 results in the undisturbed superposition of very many interference structures like those shown in FIG. 3. As a result of a superposition of this type, the resulting total interference pattern is minimized.

Figure 9A:
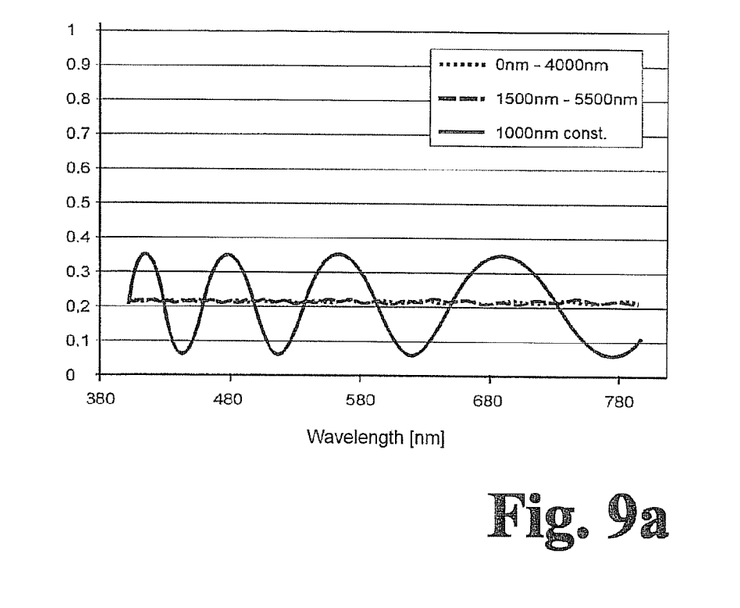
FIG. 9a is a graph showing the resulting reflectivity for two differently tilted filter structures in juxtaposition to a parallely oriented filter structure (having a constant-thickness adhesive layer)
Figure 9B:
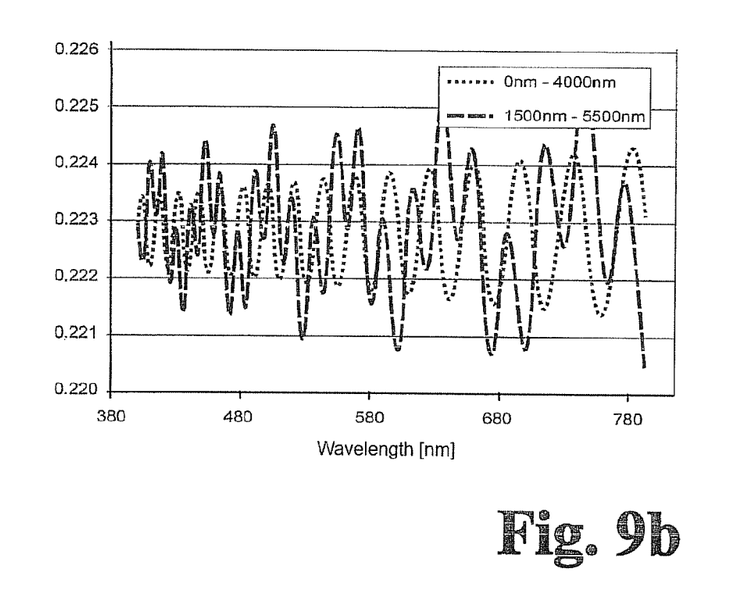
FIG. 9b is a higher-resolution chart showing the resulting reflectivity from FIG. 9a for a tilted filter structure.

FIGS. 9a and 9b show the resulting reflectivities of a filter 21 which is tilted as shown in FIG. 1. Tilting to a sufficient extent results in an optical signal that is virtually free of interference. To calculate the resulting mixed interference spectrum, the reflectivities are integrated by means of equation 4 in a determined layer thickness range for each wavelength. By way of example, in addition to the tilting from zero to 4000 nm, tilts of 1500 nm to 5500 nm were also taken into account. With respect to the remaining reduced interference ripples (residual ripple of the reflectivity), the diagram in FIG. 9a also shows the normal reflection with interference in a parallel adhesive layer 32 with a thickness of 100 nm (corresponding to FIG. 4) for purposes of comparison. Below this in FIG. 9b, the remaining ripple of the reflectivity which can barely be seen in FIG. 9a is illustrated more clearly by a high-resolution diagram.

The optical layer system of the sensor arrangement to be adapted comprises the following layers:

Zeroth Layer:

This layer is provided as sensor base material, e.g., PIN diodes, CMOS diodes and TFA structures, and transforms the incident light into a photocurrent. It represents the predefined basis of the layer system and is characterized by a high refractive index ($n_0$>4).

First Layer:

The first layer above the sensor 1 is formed at least from a $SiO_2$ layer 12. There are a number of technical solutions for minimizing interference in a passivation layer, e.g., sectorwise gradation of the passivation layer thickness by $\lambda/(4n_1)$ according to U.S. Pat. No. 7,626,241 B1 or adapting the thicknesses to optimal antireflection as is applied in the present case. In the present invention, the sensor passivation is based on a combination of $SiO_2$ layer 12 and $Si_3N_4$ layer 13. This passivation layer sequence contains a very thin $SiO_2$ layer 12 and a spectrally matched thickness of the $Si_3N_4$ layer 13. While the $SiO_2$ layer 12 has a thickness $d_0$ of merely 5-10 nm in the region of the light-sensitive sensor surface 11 rendering it inactive with respect to interference action, the $SiO_2$ layer can have conventional layer thicknesses of between 2 and 7 μm in the rest of the regions of the sensor 1. The spectrally matched thickness $d_1$ of the $Si_3N_4$ layer 13 is calculated from the refractive index $n_1$=1.95 of $SisN_4$ and from the wavelength $\lambda$ adjusted for optimization by:

$$\Delta d_1 = \lambda/(4n_1) \tag{5}$$

This gives a thickness $d_1$ of between 30 and 70 nm for the $Si_3N_4$ layer 13 for an optimal antireflection in the VIS spectral region.

Figure 6A:
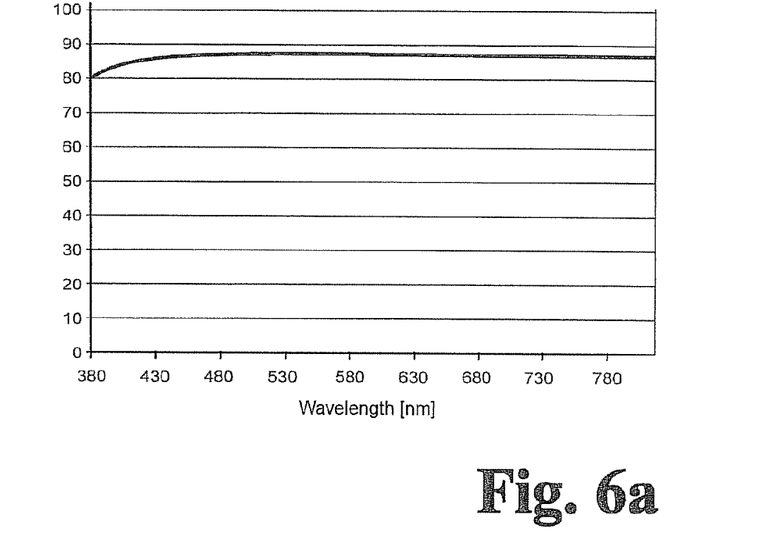
FIG. 6a is a graph showing transmission over wavelength for an antireflection-optimized layer system of the sensor passivation with a $SiO_2$ layer and a $Si_3N_4$ layer.

FIG. 6a shows the transmission behavior over wavelength for a particularly advantageous example in which the $SiO_2$ layer 12 has a thickness of $d_0$=5 nm and the $Si_3N_4$ layer 13 has a thickness of $d_1$=45 nm and which is characterized by high absolute values and high constancy of transmission (outside the blue spectral region) and shows no interference ripple.

Figure 6B:
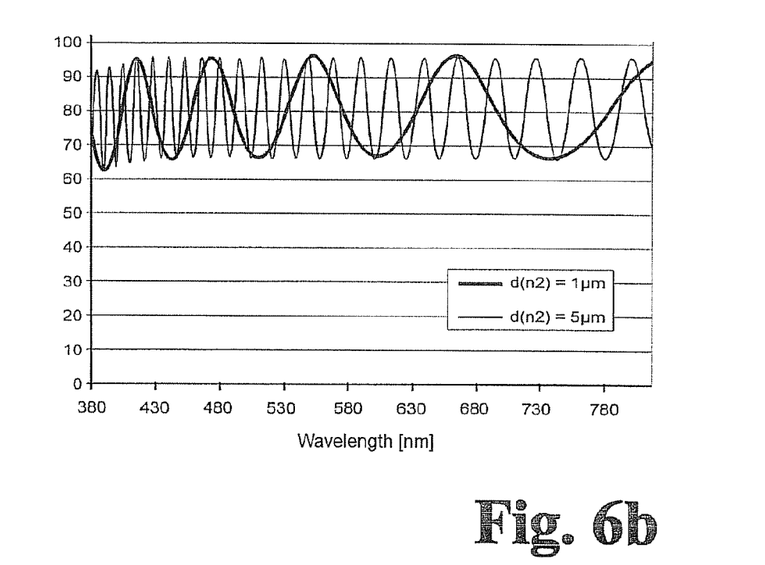
FIG. 6b is a graph showing the interferences for an embodiment of the intermediate space between sensor and filter-coated substrate with two different layer thicknesses of the adhesive layer without variation of layer thickness over the light-sensitive sensor surface.

Second Layer:

The second sequential layer before the optical substrate 2 has refractive index $n_2$. Optically transparent adhesive 31 or thin air gaps are examples of this second layer. Often, very thin layers cannot be realized in a reproducible manner by technological means so that the frequency of the interference ripples varies depending on the layer thickness. The thicker the layers, the higher the frequency of the disturbances. This is illustrated in FIG. 6b for two selected thicknesses $d_2$=1000 nm and $d_2$=5000 nm of an adhesive 31 with refractive index $n_2$=1.55. A comparable behavior results for all non-absorbing adhesives and transparent media with a refractive index in the range from 1 to 3.5.

In order to suppress these interference ripples, the thickness $d_2$ of the second layer is varied over the light-sensitive sensor surface 11 such that the optical coupling is optimized by superposition of layer interferences. This superposition can be effected by tilting or by gradations of the downstream substrate 2.

As was already described referring to FIG. 1, tilting results in a mixing of interference ripples of different frequencies with x superposition periods. The more periods are superposed, the more uniform the mixing.

$$\Delta h = x \cdot d_2 = \lambda/(2n_2) \quad (5)$$

A height variation $\Delta h$ of 2000 nm over the optically active region (light-sensitive sensor surface 11) gives a superposition of 11 periods for a wavelength $\lambda$=550 nm and a refractive index $n_2$=1.55. At an amplitude of the interference signal of 25%, there remains a ripple of less than 2%.

Figure 7:
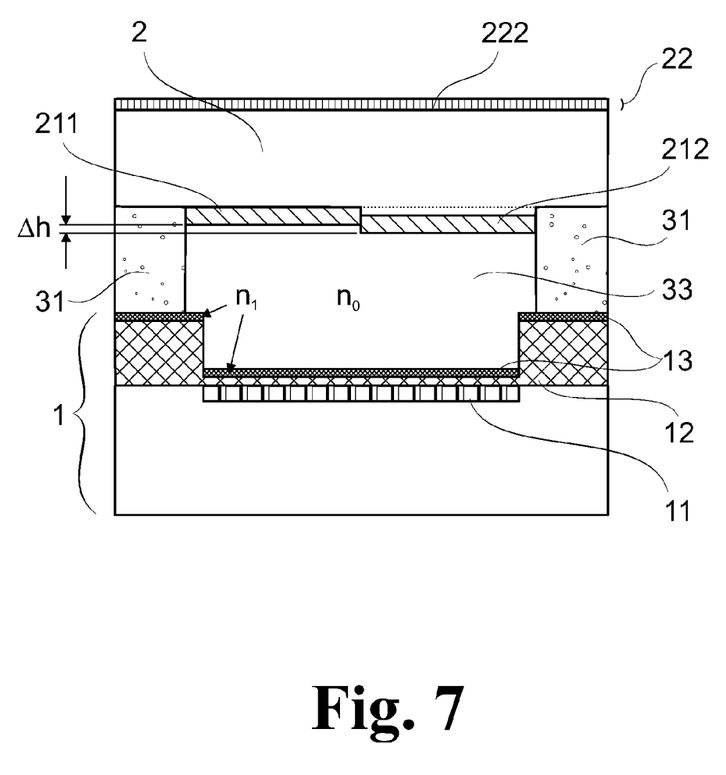
FIG. 7 is an alternative embodiment form of the invention with antireflective sensor passivation and height variation of the optical filter relative to the sensor by gradation of the substrate in two equal-sized areas.

Alternatively, it is possible to produce the height variation $\Delta h$ of the distance of the filter 21 relative to the light-sensitive sensor surface 11 by a step-shaped construction of the substrate 2 in that two sectors of equal size (e.g., half-circles) are produced in the substrate 2 with a gradation of 2000 nm for positioning two height-offset filter segments 211 and 212 as is shown schematically in a side view in FIG. 7.

The gradated sectors of the substrate 2 can be generated, for example, by structured glass deposition on the substrate 2 before the filter segments 211 and 212 are applied so as to be offset with respect to height. Through the use of uniform spacers (not shown), the filter orientation is parallel to the sensor surface 11, and the substrate 2 is fastened by adhesive 31 in the edge region around the light-sensitive sensor surface 11, and two differently spaced regions of identical size result in the intermediate space 3 above the sensor surface 11 because the filter segments 211 and 212 are offset in height due to the gradated substrate 2. An air layer 33 acting in this example as second layer in the intermediate space 3 is at least partially surrounded by the adhesive 31. However, the intermediate space 3 which is configured in a stepped manner here can also be filled with a liquid or with a continuous adhesive layer 32.

The optimal (destructive) superposition of the layer interferences is given at a height variation $\Delta h$ of the air layer 33 (as well as for every other medium usable in the intermediate space 3) by:

$$\Delta h = \tfrac{1}{2}\lambda/(2n_2) \quad (6)$$

Third Layer:

The third layer of the sensor arrangement is formed by substrate 2 which is preferably a glass substrate with at least one optical filter 21, e.g., for spectral filtering, and can further have at least one outer coating 22, e.g., in the form of an AR filter 221 (antireflection filter) or an IR edge filter 222 (only shown in FIG. 7).

Figure 8:
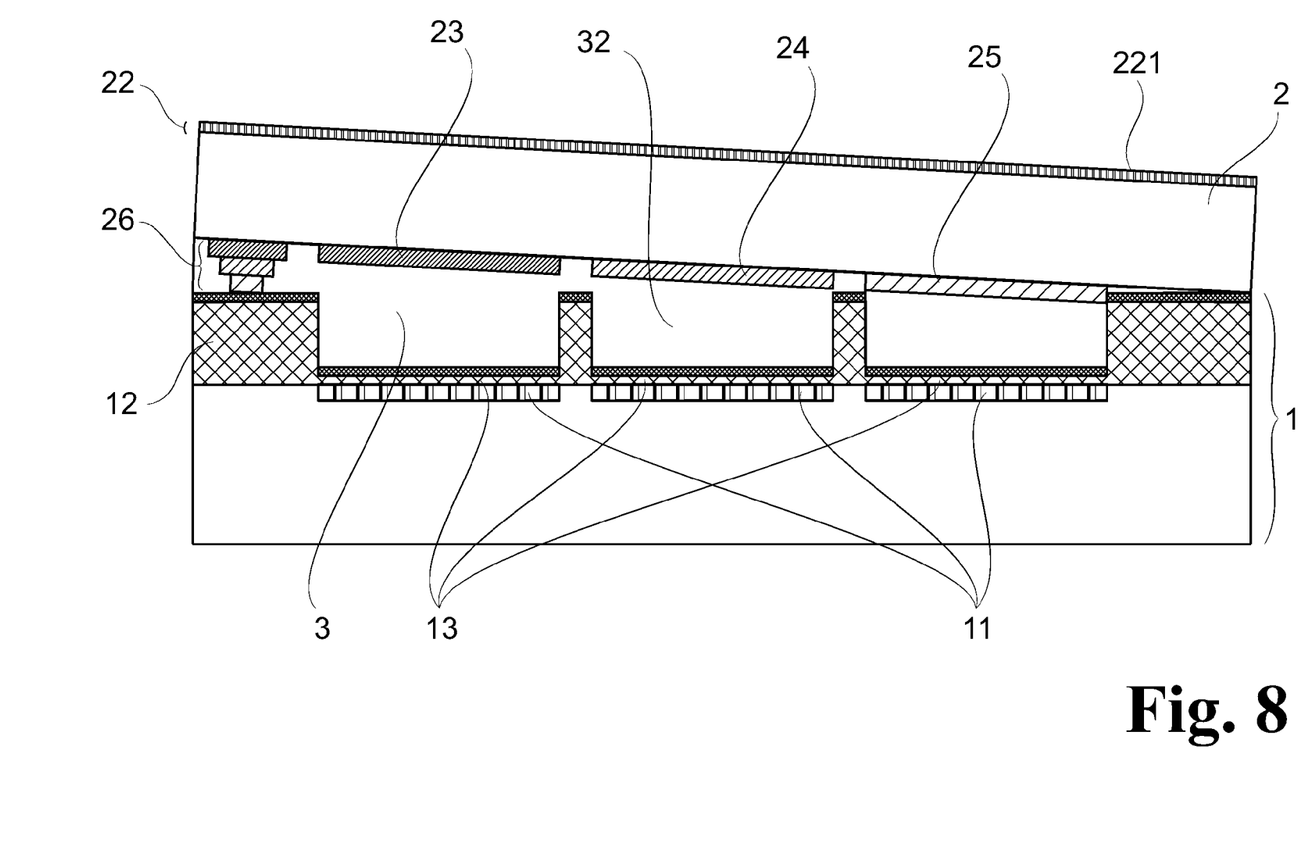
FIG. 8 is a schematic diagram showing a color sensor with three separate sensor surfaces and an adhesive layer in the intermediate space between the sensor surfaces and a substrate in which the height variation of the substrate is adjusted by reproducibly height-defined filter stacks of three spectrally different interference filters being additionally coated as exactly positioned spacers on the substrate.

In an advantageous embodiment, a color sensor arrangement with three spectrally different interference filters 23, 24, 25 is shown in FIG. 8. All three of the interference filters 23, 24, 25 are arranged on substrate 2 such that they are associated in each instance with a separate light-sensitive sensor surface 11. The sensor passivation is carried out in the region of the light-sensitive sensor surfaces 11 through the special combination of very thin $SiO_2$ layer 12 and antireflection-matched $Si_3N_4$ layer 13 as was described above with reference to the first layer. The intermediate and edge regions are produced appreciably larger. Substrate 2 is supported on these edge regions so as to be tilted in a defined manner and is directly supported on one side and held at an inclination to sensor 1 by a defined tilting at the opposite edge by spacers 26. The intermediate space 3 in this case is completely filled with adhesive 31 and produces an adhesive layer 32 with a continuous height variation $\Delta h$ over every light-sensitive sensor surface 11 such that spectrally selective signals without interference ripples can be recorded on every sensor surface 11 through the assignment of the spectrally different interference filters 23, 24 and 25.

Figure 10:
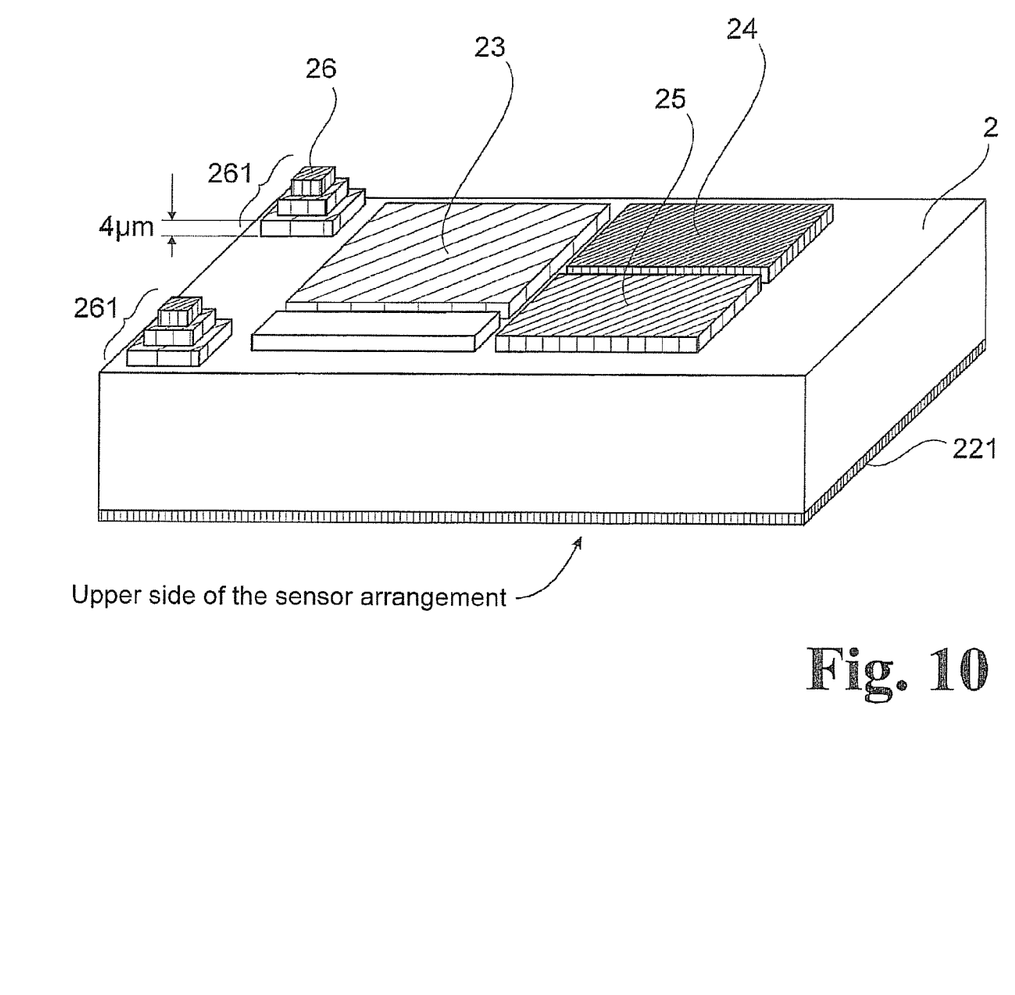
FIG. 10 is a perspective view of a specially constructed substrate with different color filters in which three successive coating processes were used for simultaneously producing color filter stacks as spacers for the substrate.

FIG. 10 shows the makeup of substrate 2 again in a perspective view in inverted position and illustrates the defined production of spacers 26 as filter stacks 261 generated together with the coating of the spectrally different interference filters 23, 24 and 25. The filter stacks 261 are made from the same filter layers in the same way and with the same height as interference filters 23, 24 and 25. In contrast to the schematic side view of the sensor arrangement in FIG. 8, the view of the substrate in FIG. 10 shows a preferred spatial distribution of the spectral interference filters 23, 24 and 25 with which the light-sensitive sensor surfaces 11 are associated so as to be oriented in a corresponding manner.

The height variation $\Delta h$ of the distance of the filter 21 relative to the light-sensitive sensor surface 11 according to the invention has the advantage over the prior art that the influences of the disrupting interference structures on the optical response of the system are minimized by these steps. By means of a construction defined in this way, the optical filters 23, 24, 25 can be calculated beforehand very precisely for the desired spectral characteristic of a color sensor arrangement according to FIGS. 8 and 10.

LIST OF REFERENCE NUMERALS 1 sensor
11 light-sensitive sensor surface
12 $SiO_2$ layer
13 $Si_3N_4$ layer
2 substrate
21 (optical) filter (system)
211, 212 (height-offset) filter segment
22 outer coatings
221 AR filter
222 IR edge filter
23, 24, 25 spectrally different interference filters
26 spacer
261 filter stack
3 intermediate space 3 (between sensor passivation and substrate)
31 adhesive
32 adhesive layer
33 air layer $d_0$ thickness of the SiO$_2$ layer
$d_1$ thickness of the Si$_3$N$_4$ layer
$d_2$ thickness of the adhesive layer (of the intermediate space)
$\Delta h$ height variation of the intermediate space (of the adhesive layer)
$n_0$ refractive index (of air)
$n_1$ refractive index (of the Si$_3$N$_4$ layer)
$n_2$ refractive index (of the adhesive)
x quantity of superposition periods
$\phi_e$ angle of incidence

What is claimed is:

1. A sensor arrangement with at least one silicon-based optical sensor comprising:
    a sensor passivation comprising a combination of a SiO$_2$ layer and an antireflection-matched Si$_3$N$_4$ layer, wherein the SiO$_2$ layer has a thickness in a range from 5 to 10 nm;
    a substrate disposed above the sensor passivation, the substrate carrying at least one optical filter and being connected to the sensor by an adhesive in that way to form an intermediate space between a light-sensitive sensor surface and the at least one optical filter; the intermediate space being filled with an optical medium having a lower refractive index ($n_2$) than that of the sensor passivation of the sensor, wherein the optical medium of the intermediate space between sensor passivation and substrate has a height variation ($\Delta h$) over the light-sensitive sensor surface,
    wherein the height variation ($\Delta h$) is formed by tilting the substrate relative to the light-sensitive sensor surface.

2. The sensor arrangement according to claim 1, further comprising spacers disposed at predetermined positions on the substrate for a defined adjustment of the tilting of the substrate each spacer having a defined height produced by separated filter layers during the process of successive coating of the optical filters having a known layer thicknesses.

3. The sensor arrangement according to claim 1, wherein the height variation ($\Delta h$) is determined by a defined gradation of the substrate relative to the light-sensitive sensor surface in areas of equal size for arranging at least two height-offset filter segments.

4. Sensor arrangement according to claim 3, wherein the gradation of the substrate is produced by structured glass deposition on the substrate.

5. The sensor arrangement according to claim 1, wherein the intermediate space comprises an adhesive layer as the optical medium.

6. The sensor arrangement according to claim 1, wherein the intermediate space comprises an air layer as the optical medium, the air layer being at least partially surrounded by the adhesive.

7. The sensor arrangement according to claim 1, wherein the tilting is adjusted to generate interference ripples of different frequencies which are mixingly superposed and mutually compensating by selecting a quantity (x) of superposition periods.

8. The sensor arrangement according to claim 7, wherein the height variation ($\Delta h$) for optimal tilting is adjusted according to an equation $\Delta h = x(+)\lambda/(2n_2)$, where x is the quantity of superposition periods, $\lambda$ is a wavelength of a light incident to the light-sensitive sensor surface, and $n_2$ is the refractive index of the adhesive.

9. The sensor arrangement according to claim 3, wherein the defined gradation of the substrate is adjusted to generate interference ripples of different phase-shifted frequencies which are destructively superposed and mutually compensating.

10. The sensor arrangement according to claim 9, wherein the height variation ($\Delta h$) of the gradation of the substrate for optimal compensation of different-phase shifted interference ripples in a two-filter segment arrangement is determined by the following equation $\Delta h = \frac{1}{2}\lambda/(2n_2)$, where $\lambda$ is a wavelength of a light incident to the light-sensitive sensor surface and $n_2$ is the refractive index of the adhesive, the intermediate space being filled with an optical medium having a lower refractive index ($n_2$).

* * * * *